United States Patent
Chan et al.

(10) Patent No.: US 6,943,539 B2
(45) Date of Patent: Sep. 13, 2005

(54) ELECTRICITY METER WITH MULTIPLE GAINS SIGNAL TO AN A/D CONVERTER

(75) Inventors: Vincent Wei Chit Chan, Hong Kong (CN); Stephen J. Underwood, Hong Kong (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/735,532

(22) Filed: Dec. 11, 2003

(65) Prior Publication Data

US 2005/0001610 A1 Jan. 6, 2005

Related U.S. Application Data

(60) Provisional application No. 60/484,431, filed on Jul. 2, 2003.

(51) Int. Cl.[7] ............................................. G01R 11/32
(52) U.S. Cl. ..................................................... 324/142
(58) Field of Search ............................ 324/140 R–142, 324/103 R, 107, 76.11; 702/60; 330/127–129, 254, 278

(56) References Cited

U.S. PATENT DOCUMENTS

| | | | | | |
|---|---|---|---|---|---|
| 4,182,983 A | * | 1/1980 | Heinrich et al. | ............ | 324/142 |
| 4,837,504 A | * | 6/1989 | Baer et al. | .................. | 324/142 |
| 4,931,725 A | * | 6/1990 | Hutt et al. | .................. | 324/142 |
| 5,657,237 A | * | 8/1997 | Mazzoni | ...................... | 702/60 |

* cited by examiner

*Primary Examiner*—Vinh P. Nguyen
(74) *Attorney, Agent, or Firm*—J. Dennis Moore; W. James Brady, III; Frederick J. Telecky, Jr.

(57) ABSTRACT

An auto-ranging electricity meter circuit having multiple current signal paths. Each of the current signal paths are amplified by a different amount of gain, and then applied to an ADC. The ADC then converts each of the amplified signals at different gains in a continuous process. The system analyzes the different sets of samples to determine which is the most accurate to use. Advantages include improved accuracy of an electricity meter using a lower cost A/D converter.

4 Claims, 2 Drawing Sheets

US 6,943,539 B2

ELECTRICITY METER WITH MULTIPLE GAINS SIGNAL TO AN A/D CONVERTER

PRIORITY CLAIM

This application claims priority of U.S. Provisional Patent, Ser. No. 60/484,431, filed Jul. 2, 2003, entitled "Electricity Meter With Multiple Gain Signals To An A/D Converter", the teaching of which are incorporated herein by reference.

TECHNICAL FIELD OF THE INVENTION

This invention relates to electricity or power meters, and more particularly to low cost electricity meter with multiple gain signals sent to the A/D converter.

BACKGROUND OF THE INVENTION

In a typical electricity meter measurement environment, the amount of electric current or power consumed can vary by as much as a hundred times as different appliances are switched on an off. One type of digital electricity meter has a high resolution ADC with enough resolution to measure the current signal under the full range of variation and yet keep within the required accuracy specifications. However, since high resolution ADCs are expensive, "auto-ranging" techniques were developed that use an external amplifier together with a lower resolution ADC to achieve the same accuracy requirement at lower cost.

In auto-ranging, as the amount of electric current decreases, the current signal will get weaker. In response, the auto-ranging circuit will increase the gain of an amplifier to boost the current signal before it goes into the A/D converter. This keeps the amplifier's output range dynamically matched with the A/D converter's input range so that even under weak current conditions the A/D output will be in the proper range. The system tracks the gain used by the amplifier and scales the results accordingly. For example, a 60 A current gives an A/D output of 0–200 with an 8-bit ADC. When the current drops to 15 A (one quarter of its original value), in an auto-ranging system, the gain of the amplifier is increased by 4 times so that the signal looks like a 60 A signal to the A/D and it still output between 0–200 at 8 bit resolution. So effectively, the dynamic range is (0–200)×4 which is the same as that of a 10 bit ADC.

The ideal situation is to perform auto-ranging on every sample, however, system limitations, like the gain switching speed of the amplifier and the stability of the circuit etc., limits the auto-ranging to blocks of samples. Typically, this block consists of thousands of samples which take about 0.5 seconds to 1 second to complete.

FIG. 1 illustrates a problem with prior art auto-ranging systems. Because the prior art circuit processed the data in blocks, if the amount of current consumed suddenly increases from a very small amount to a very large amount 10 during a block, then it is quite possible that the gain setting of the amplifier is so large that the amplifier goes into saturation 12 (limited output). When the amplifier goes into saturation, the A/D reading will be inaccurate for the saturation portion of the block. The reading will be incorrect until the system re-adjusts the gain for a subsequent block 14 to prevent the saturation 16. In certain types of appliances like an electric water heater, this sudden increased current consumption can happen in bursts as the thermostat switches on and off continuously and therefore the auto-ranging system can yield very inaccurate results.

FIG. 1a shows the 1$^{st}$ block suffers from error before the gain is adjusted. FIG. 1b shows the second block has the correct gain setting.

SUMMARY OF THE INVENTION

The present invention overcomes problems associated with the described prior art auto-ranging circuit. In a preferred embodiment, multiple current signal paths are amplified by a different amount of gain, and then applied to the ADC. The ADC then converts each of the amplified signals at different gains in a continuous process. The system analyzes the different sets of samples to determine which is the most accurate to use.

Advantages of an embodiment of the present invention include improved accuracy of an electricity meter using a lower cost A/D converter.

DETAILED DESCRIPTION OF THE INVENTION

Figure 1A:
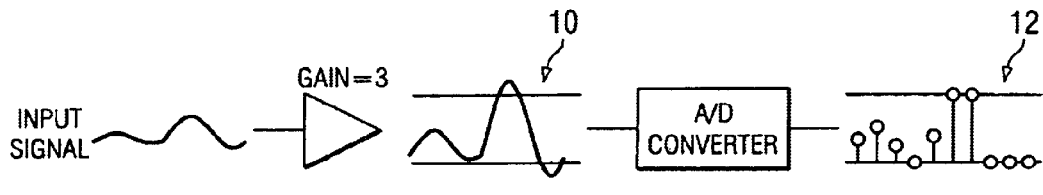
FIG. 1 illustrates an electricity meter system according to the prior art.
Figure 1B:
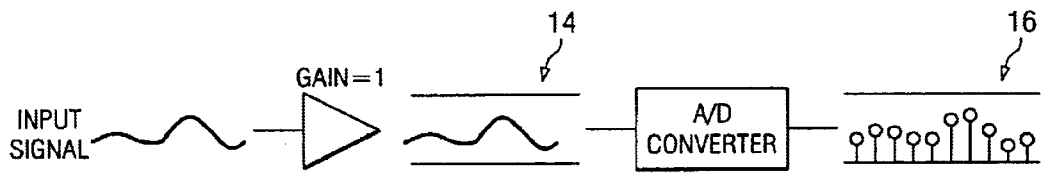
Figure 2:
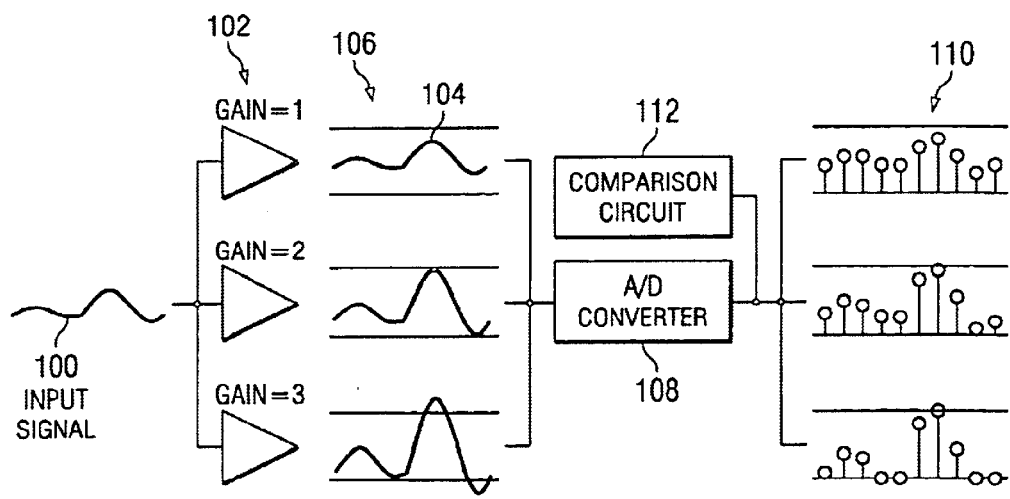
FIG. 2 illustrates an electricity meter system according to an embodiment of the present invention.

FIG. 2 illustrates the solution according to an embodiment of the present invention. In the illustrated embodiment, multiple current paths are amplified by a different amount of gain, and then applied to the ADC. The ADC then converts each of the amplified signals at different gains in a continuous process. The system analyzes the different sets of samples to determine which is the most accurate to use.

In FIG. 2, an input signal 100 is applied to three amplifiers 102 each having a different gain to produce output signals 104. The output of the amplifiers is shown graphed over the input range 106 of the A/D converter 108. Depending on the gain, the amplified signals may exceed the upper or lower limit of the input range 106 of the A/D converter. Each of the amplified output signals 104 is applied to the input of the A/D converter 108. The A/D converter produces a group of data points 110 for each of the amplifier output signals. Each group of data points is analyzed in a comparison element 112, for example in a suitably programmed digital microprocessor or microcontroller circuit. The group of data points that has the highest gain amplifier and no saturation points is used for determining the current used in the system.

Figure 3:
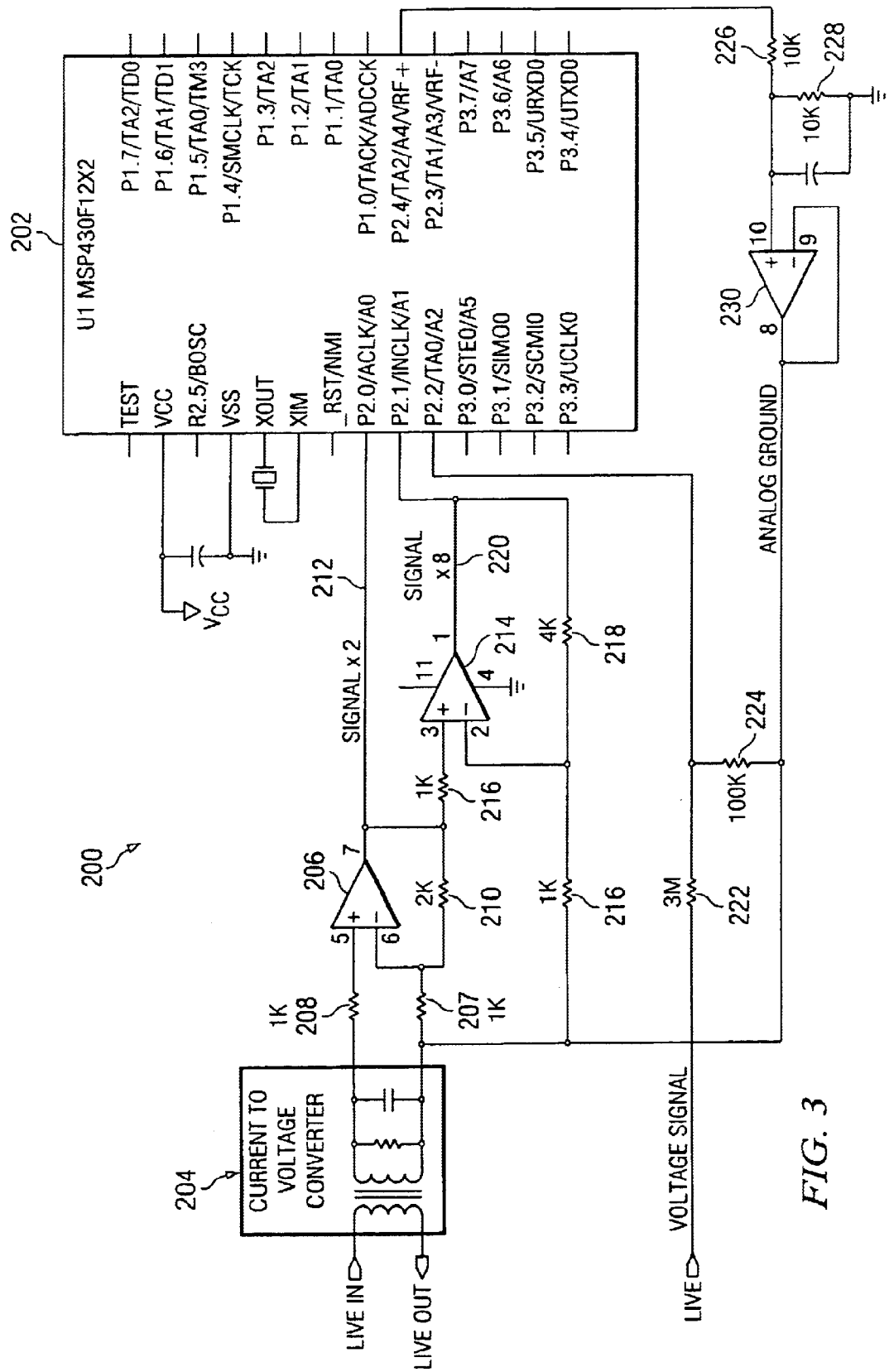
FIG. 3 illustrates an electricity meter system according to another embodiment of the present invention.

FIG. 3 illustrates another embodiment 200 of the present invention, which shows an electricity meter using a digital microprocessor or microcontroller circuit. Also in this embodiment, multiple current paths are amplified by a different amount of gain, and then applied to an ADC, in this case located within a micro-processor chip 202. The ADC then converts each of the amplified signals at different gains in a continuous process. The system analyzes the different sets of samples to determine which is the most accurate to use in conjunction with the measured voltage to determine the power used.

In the preferred embodiment illustrated in FIG. 3, the current being measured (current through inputs Live IN and Live Out) is applied to a current to voltage converter 204. The voltage converter 204 outputs a voltage proportional to the current flow being measured by the electricity meter. This voltage representing the current is applied to a first amplifier 206. The first amplifier 206 multiplies the input current representing voltage 2 times (in this case using 1 k resistors 208 at the input and a 2 k feedback resistor 210). The output 212 of the first amplifier 206 is coupled to the microprocessor 202 to input a first amplified signal into the microprocessor. The output 212 of the first amplifier 206 is also coupled to the input of a second amplifier 214.

In this embodiment the second amplifier 214 amplifies the input voltage representing the current an additional 4 times, resulting in an output 8 times the voltage signal from the current to voltage converter. The second amplifier uses 1 k resistors 216 at the input and a 4 feedback resistor 218. The output 220 of the second amplifier 214 is coupled to the microprocessor 202 to input a second amplified signal into the microprocessor.

The electricity meter shown in FIG. 3 also inputs the voltage of the power being measured to compute the power. The input "live voltage signal" is reduced by a resistor divider to a level that the ADC can measure. For example, from 240 volts AC to 2.5v peak to peak. The divider in this embodiment has a 3 M resistor 222 over a 3 K resistor 224. The point between the two resistors is connected to the microprocessor to provide a reduced reference voltage to the microprocessor that represents the voltage of the signal being measure by the electricity meter.

The illustrated embodiment shown in FIG. 3 uses a voltage bias circuit 222 to provide a bias reference voltage to the amplifiers and voltage divider circuits described above. The current and voltage being measured by the electricity meter are analog signals that vary from a positive to negative value. The bias voltage circuit 222 lifts up the voltage applied to the amplifiers 206, 214 and the voltage divider to hold these voltages in a positive range that can be measured by the ADC inside the microprocessor 202. The voltage bias circuit 222 uses a reference voltage output from the microprocessor. The reference voltage is multiplied by 0.5 using the divider circuit 228 composed of two 10 k resistors. The divided reference voltage is applied to a unity gain amplifier 230. The unity gain amplifier supplies the reference voltage as described above to the amplifiers 206, 214 and the voltage divider for the voltage input signal 222, 224.

Other Embodiments

Although the present invention has been described in detail, it should be understood that various changes, substitutions, and alterations could be made hereto without departing from the spirit and scope of the invention as defined by the appended claims.

What is claimed is:

1. An electricity meter electrical circuit comprising:
   a. a plurality of gain stages for amplifying an input signal that is proportional to electricity usage to create a plurality of amplified electricity usage signals;
   b. an A/D converter for converting the plurality of amplified electricity usage signals into a block of digital samples for each of the plurality of amplified electricity usage signals; and
   c. a comparison circuit for analyzing the block of digital samples and determining which block of digital samples most accurately represents the input signal,
   wherein the plurality of gains stages comprise a first and second gain stage, wherein the first stage amplifies the signal times two, and the second amplifies the output of the first stage times 4.

2. An electricity meter electrical circuit comprising:
   a. a plurality of gain stages for amplifying a voltage of an input signal that is proportional to electricity usage to create a plurality of amplified electricity usage signals;
   b. an A/D converter for converting the plurality of amplified electricity usage signals into a block of digital samples for each of the plurality of amplified electricity usage signals;
   c. a comparison circuit for analyzing the block of digital samples and determining which block of digital samples most accurately represents the input signal; and
   d. a voltage bias circuit to lift the input signal voltage into a positive varying input.

3. An electricity meter electrical circuit comprising:
   a. a micro-processor/micro-controller;
   b. a plurality of gain stages for amplifying an input current signal that is proportional to electricity usage to create a plurality of amplified electricity usage signals;
   c. an A/D converter for converting the plurality of amplified electricity usage signals into a block of digital samples for each of the plurality of amplified electricity usage signals;
   d. a comparison circuit in the micro-processor/micro-controller to determine which block of digital samples most accurately represents the input signal; and
   wherein the plurality of gains stages comprise a first and second gain stage, wherein the first stage amplifies the signal times two, and the second amplifies the output of the first stage times 4.

4. An electricity meter electrical circuit comprising:
   a. a micro-processor/micro-controller;
   b. a current to voltage converter for converting an input current signal that is proportional to eletricity usage to an input voltage signal;
   c. a plurality of gain stages for amplifying an input voltage signal to create a plurality of amplified electricity usage signals;
   d. an A/D converter for converting the plurality of amplified electricity usage signals into a block of digital samples for each of the plurality of amplified electricity usage signals;
   e. a comparison circuit in the micro-processor/micro-controller to determine which block of digital samples most accurately represents the input signal; and
   f. a voltage bias circuit to lift the input signal voltage into a positive varying input.

* * * * *